(12) United States Patent
Glynn et al.

(10) Patent No.: US 8,649,459 B2
(45) Date of Patent: Feb. 11, 2014

(54) BIT REDUCTION IN A TRANSMITTER

(75) Inventors: Stuart Francis Glynn, Basingstoke (GB); Shinichi Tanabe, Tokyo (JP)

(73) Assignee: Sony Corporation, Tokyo (JP)

( * ) Notice: Subject to any disclaimer, the term of this patent is extended or adjusted under 35 U.S.C. 154(b) by 962 days.

(21) Appl. No.: 12/423,606

(22) Filed: Apr. 14, 2009

(65) Prior Publication Data

US 2009/0257513 A1 Oct. 15, 2009

(30) Foreign Application Priority Data

Apr. 15, 2008 (GB) .................................. 0806831.4

(51) Int. Cl.
 *H04L 27/00* (2006.01)
(52) U.S. Cl.
 USPC .......................................... 375/295; 375/243
(58) Field of Classification Search
 USPC .................... 375/299, 295, 243, 245
 See application file for complete search history.

(56) References Cited

U.S. PATENT DOCUMENTS

| | | | | |
|---|---|---|---|---|
| 5,124,706 | A * | 6/1992 | Gerdes | 341/156 |
| 5,696,710 | A | 12/1997 | Hague et al. | |
| 6,389,069 | B1 | 5/2002 | Mathe | |
| 6,639,531 | B1 * | 10/2003 | Melanson | 341/143 |
| 2002/0051502 | A1 * | 5/2002 | Mathe | 375/316 |
| 2002/0152250 | A1 | 10/2002 | Staszewski | |
| 2004/0044712 | A1 | 3/2004 | Staszewski | |
| 2004/0174528 | A1 * | 9/2004 | Humphrey | 356/464 |
| 2005/0110667 | A1 * | 5/2005 | Borisavljevic | 341/152 |
| 2009/0072921 | A1 * | 3/2009 | Schmid | 332/145 |
| 2009/0103750 | A1 * | 4/2009 | Chilakapati et al. | 381/94.5 |
| 2009/0258612 | A1 * | 10/2009 | Zhuang et al. | 455/110 |

FOREIGN PATENT DOCUMENTS

| | | |
|---|---|---|
| CN | 1156279 A | 8/1997 |
| CN | 1338149 A | 2/2002 |
| EP | 0782319 | 7/1997 |
| JP | 2000-252794 | 9/2000 |

OTHER PUBLICATIONS

Huirae Cho and Jin-up Kim, "An Efficient Method for Compensating the Truncation DC-Error in a Multi-stage Digital Filter", Proceedings of the IEEE International Symposium on Communications and Information Technologies 2004 (ISCIT 2004), Oct. 26-29, 2004, Sapporo, Japan, vol. 1, pp. 190-193. ISBN: 0-7803-8593-4.

Combined Chinese Office Action and Search Report issued Jan. 5, 2013 in Patent Application No. 200910133180.X (English Translation).

* cited by examiner

*Primary Examiner* — Emmanuel Bayard
(74) *Attorney, Agent, or Firm* — Oblon, Spivak, McClelland, Maier & Neustadt, L.L.P.

(57) ABSTRACT

A digital baseband signal for radio frequency transmission is processed prior to performing digital-to-analog conversion. The digital baseband signal is filtered. The number of bits of the digital baseband signal is reduced to minimise the size of the digital-to-analog converter. By performing some of the bit reduction before filtering, the size of the filter circuit is reduced whilst still meeting relevant performance parameters.

31 Claims, 4 Drawing Sheets

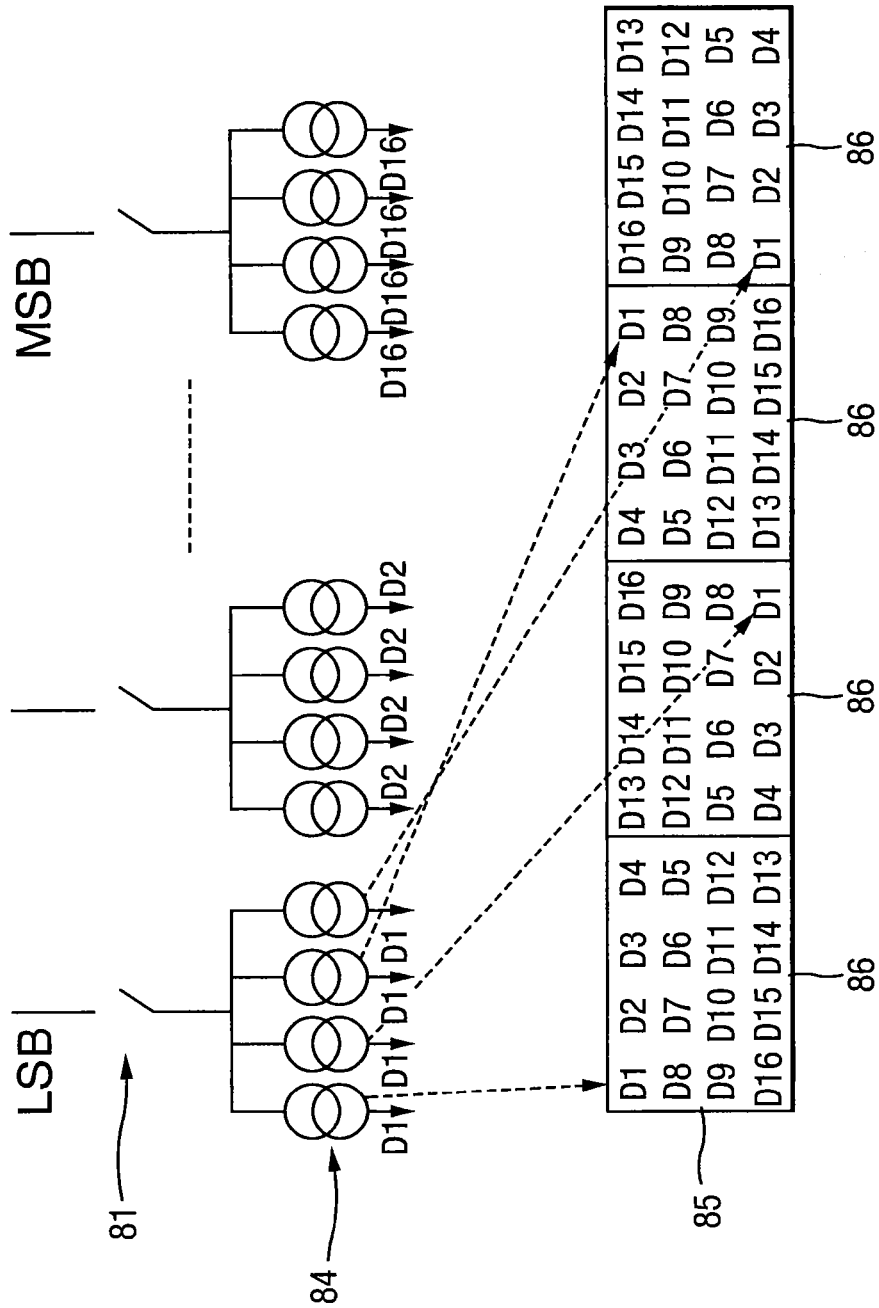

BIT REDUCTION IN A TRANSMITTER

CROSS-REFERENCE TO RELATED APPLICATIONS

This application is based upon, and claims the benefit of priority under 35 U.S.C. §119 from, the United Kingdom Application No. GB0806831.4, filed Apr. 15, 2008, the entire contents of which are incorporated herein by reference.

BACKGROUND OF THE INVENTION (1) Field of the Invention

The present invention relates to radio frequency transmission, and in particular to the design of circuits for radio frequency transmission.

(2) Description of Related Art

Typically in radio frequency transmission, a digital baseband signal is produced and processed in the digital domain for example including finite impulse response filtering before analog-to-digital conversion. Circuits for performing the processing and digital-to-analog converters (DACs) are usually implemented in an integrated circuit (IC). Usually the transmission circuits and reception circuits are implemented in a common integrated circuit referred to as a transceiver.

In general terms, it is desirable to minimise the size of the ICs used in order to minimise the cost of manufacture. Conversely, the integrated circuit size can only be minimised within the constraint of meeting the desired performance parameters. The present invention is concerned with techniques for so minimising the size of the ICs used, whilst meeting performance parameters.

By way of example, such considerations occur is in a 3G (3rd generation) cellular telephone. Two recent changes within the field of transceiver ICs for 3G cellular telephones are (1) the requirement for HSPA (High Speed Packet Access) compliance, and (2) the change in the partitioning between the baseband and transceiver ICs. Previously all digital baseband functions were carried out in the baseband IC and the interface between it and the transceiver IC was purely analogue. More recent standards require the interface to be digital, working to DigRF or similar standards for high speed serial interfacing. This change in partitioning means that some digital baseband functions are carried out in the transceiver IC. Signal conversion (i.e. digital-to-analog for the transmitter) is also now carried out in the transceiver IC.

BRIEF SUMMARY OF THE INVENTION

According to the present invention, there is provided a method of processing an input digital baseband signal for radio frequency transmission, prior to supplying the processed digital baseband signal to a digital-to-analog converter, the input digital baseband signal having a number of bits greater than the processed digital baseband signal supplied to the digital-to-analog converter, the method comprising:

first reducing the number of bits of the input digital baseband signal;

filtering the input digital baseband signal after said first reducing of the number of bits; and further reducing the number of bits of the input digital baseband signal after said filtering.

According to a further aspect of the present invention, there is provided an integrated circuit for processing an input digital baseband signal for radio frequency transmission implementing a similar method.

Thus the present invention involves reducing the number of bits of the digital baseband signal prior to supplying the processed digital baseband signal to a digital-to-analog converter (DAC). This has the advantage of reducing the size of the DAC used to perform the conversion. Quite simply, the reduced number of bits reduces the component count of the DAC. The degree of bit reduction varies from case-to-case but in general is chosen so that the signal still meets the desired performance parameters depending on the application of the transmission circuit.

However, beyond bit reduction per se, the present invention involves performance of bit reduction both before and after filtering of the digital baseband signal. It has been appreciated that particular advantage is achieved by splitting up the bit reduction in this manner. In particular it has been appreciated that by performance of some of the bit reduction before filtering, the size of the filter circuit used may be reduced. Again, the reduced number of bits reduces the component count of the filter circuit. However, it has also been appreciated that performance of all the bit reduction before the filter circuit would degrade the performance such that it the relevant performance parameters cannot be met. Therefore only part of the bit reduction is performed before the filtering, the rest of the bit reduction being performed afterwards.

The invention has particular application to a situation in which the digital baseband signal contains plural channels having differing gain factors, typically including one or more data channels and one or more control channels, for example a digital baseband signal in accordance with the 3GPP standard. In this case, performance of all the bit reduction before the filter circuit can degrade performance parameters concerned with the relative power of the different channels, for example Code Domain Power Accuracy, and so it is advantageous to perform as much bit reduction before the filtering as possible within the constraint of meeting such parameters, and performing further bit reduction after the filtering.

The bit reduction before and after the filtering may comprise truncating the digital baseband signal to eliminate one or more of the least significant bits. However further advantage may be achieved by the bit reduction after the filtering further comprising limiting the digital baseband signal to eliminate one or more of the most significant bits. This has been found to be capable of introducing further reduction in the bit count without causing some performance parameters to fail to be met, because the largest signal peaks which are affected by such limitation are relatively rare events in practice.

BRIEF DESCRIPTION OF THE DRAWINGS

In the drawings:

FIG. 9 is a diagram of a modified form of the part of the current-switched DAC stage including the current sources and a diagram of the layout of the current sources in an IC.

DETAILED DESCRIPTION OF THE INVENTION

An embodiment of the present invention will now be described by way of non-limitative example with reference to the accompanying drawings.

Figure 1:
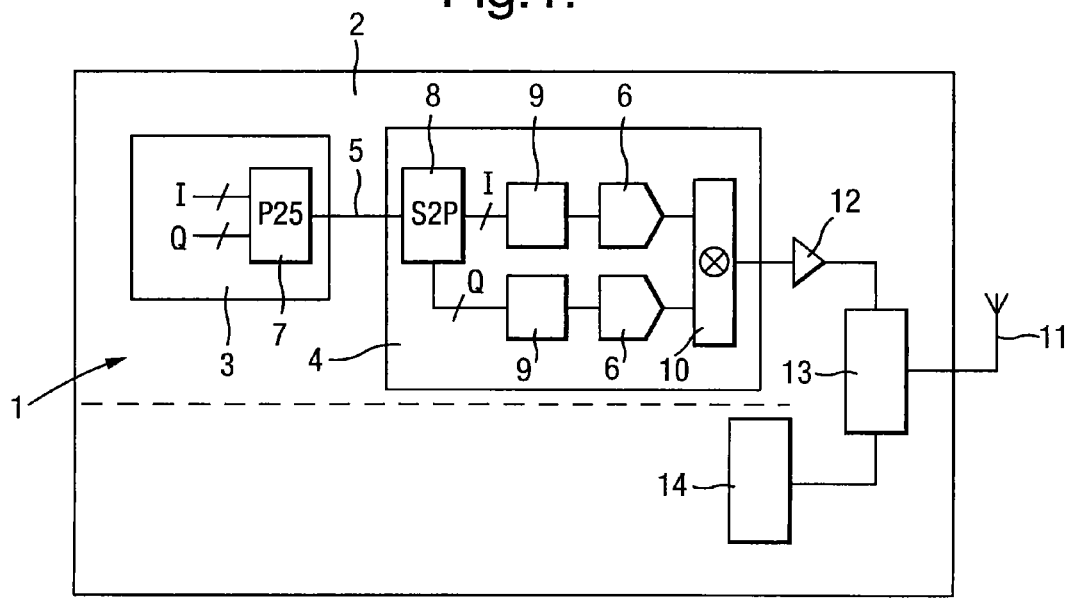
FIG. 1 is a diagram of a transmission circuit in a portable device.

FIG. 1 shows a transmission circuit 1 in a portable electronic device 2, such as a cellular telephone. In this example, the transmission circuit 1 is accordance with a 3G standard, in particular the 3G Partnership Project (3GPP) standard which is a 3G standard meeting the International Mobile Telecommunications-2000 (IMT-2000) specification. The portable electronic device 2 also contains a reception circuit 14.

The transmission circuit 1 comprises a digital baseband IC 3 and a transmitter IC 4. The reception functions (not described) could be performed by the digital baseband IC 3 and the transmitter IC 4, in which case the transmitter IC 4 could be referred to as a transceiver.

The partitioning between the digital baseband IC 3 and the transmitter IC 4 is such that the signal passed therebetween is in the digital domain, being a digital baseband signal produced by the digital baseband IC 3. The digital baseband signal is passed from the digital baseband IC 3 to the transmitter IC 4 using an interface 5 compliant with HSUPA (High Speed Uplink Packet Access) and more generally HSPA (High Speed Packet Access) which forms part of the 3G standard. The interface 5 is thus a high speed serial interface working to DigRF or similar standards over which data is transmitted in packets.

This is in contrast to previous standards in which all digital baseband processing was carried out in a baseband IC with an analog interface to a transmitter circuit. Thus signal conversion is carried out in the transmitter IC 4 by DACs 6 described further below.

The digital baseband IC 3 produces a digital baseband signal having the following construction in accordance with the 3GPP specification 25.213 section 4. The digital baseband signal is made up of several dedicated physical channels, namely:

DPCCH, being a control channel;
DPDCH, being a data channel of which there could be several;
HS-DPCCH, being a control channel for HSDPA (High Speed Downlink Packet Access), which is the receiver part of HSPA;
E-DPCCH, being a control channel for HSUPA;
E-DPDCH, being a data channel for HSUPA of which there could be several.

The simplest 3G signal can consist of just DPCCH, whereas more complicated signals can contain all channels.

In the construction of the digital baseband signal, the digital baseband IC performs the following steps on each channel to be transmitted:

1. Assignment of a 1-bit NRZ (non-return to zero) data sequence;
2. Spreading, being multiplication with a spreading code;
3. Weighting, being multiplication with a gain factor; and
4. IQ assignment, wherein each channel is assigned to either an I (in-phase) or Q (quadrature) branch of a quadrature modulation scheme.

After this, all channels are summed together and then scrambled with a complex scrambling code, 'Is+jQs'. A preferred method of scrambling is to use a mapping function outlined below:

| Is | Qs | TXI' | TXQ' |
|----|----|------|------|
| 1  | -1 | Iin  | Qin  |
| 1  | -1 | Qin  | -Iin |
| -1 | 1  | -Qin | Iin  |
| -1 | 1  | -Iin | -Qin | wherein Iin and Qin are the I and Q branches before scambling and TXI' and TXQ' are the I and Q branches after scrambling.

The digital baseband IC 3 has a parallel-to-serial converter 7 to convert the I and Q branches of the digital baseband signal into serial data which is then supplied over the interface. Similarly, the transmitter IC 4 has a serial-to-parallel converter 8 which converts the digital baseband signal back into the parallel I and Q branches.

Each of the I and Q braches is passed through a respective processing circuit 9, described further below, before supply to the a respective DAC 9 which performs digital-to-analog conversion to convert the digital baseband signal into the analog domain. The I and Q branches of the analog baseband signal output from the DACs 9 are supplied to a modulation circuit 10 which modulates the analog baseband signal onto a carrier in accordance with the quadrature modulation scheme to generate a transmission signal.

The transmission signal is then supplied from the transmitter IC 4, via an amplifier 12 and a duplexer 13, to an antenna 11 of the portable electronic device 2 for transmission. The duplexer 13 is also connected to the reception circuit 14 for supplying a received signal from the antenna 11.

Figure 2:
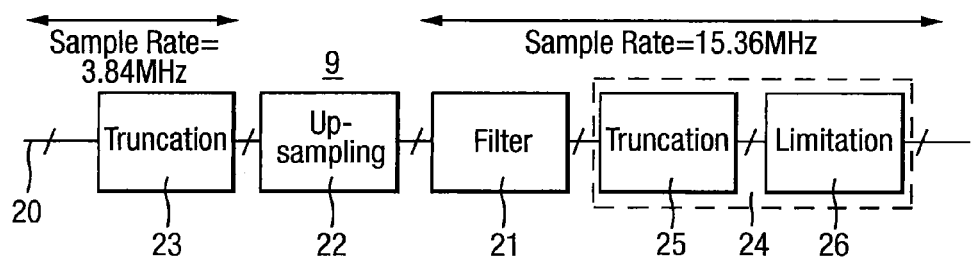
FIG. 2 is a diagram of a branch of the transmitter integrated circuit chip of the transmission circuit.

The processing circuits 9 of the transmitter IC 4 will now be described. The processing circuit 9 in each of the I and Q branches is identical and arranged as shown in FIG. 2.

The digital baseband signal 20 provided by the digital baseband IC 3 and input to the processing circuit 9 consists of 16-bit samples at a sample rate of 3.84 MHz.

The processing circuit 9 includes a filter circuit 21 to filter the digital baseband signal 20 in accordance with the 3GPP specification. The response of the filter circuit 21 is RRC (Root Raised Cosine), its impulse response being specified in 3GPP 25.101 section 6.8.1. To meet this specification, the filter circuit 21 is usually implemented as an FIR (Finite Impulse Response) filter.

The processing circuit 9 also includes an upsampling circuit 22 which upsamples the digital baseband signal 20 before supply to the filter circuit 21. The upsampling is at a rate of four times the existing sampling rate of the digital baseband signal 20 and so provides the digital baseband signal 20 with a sampling rate of 15.36 MHz. This remains the sampling rate of the digital baseband signal 20 when supplied to a DAC 6.

The processing circuit 9 also performs bit-reduction to reduce the number of bits of the digital baseband signal 20. The bit reduction is performed to minimise the size of the DAC 6 which has the advantage of minimising the cost of manufacture. In particular a bit-reduction from 16 to 11 bits is achieved so that the digital baseband signal has 11 bits when output from the processing circuit 9. However, the bit reduction is also performed in a manner which allows the relevant performance parameters of the 3GPP standard to be met, as will now be described.

The performance of bit reduction is split between a first bit reduction circuit 23 arranged before the filter circuit 21 and a second bit reduction circuit 24 arranged after the filter circuit 21. The first bit reduction circuit 23 is in this example arranged before the upsampling circuit 22. The order of the first bit reduction circuit 23 and the upsampling circuit 22 can be reversed, although this increases the amount of processing the first bit reduction circuit 23 needs to perform.

The first bit reduction circuit 23 reduces the number of bits of the digital baseband signal 20 input to the processing circuit 9 by truncating the digital baseband signal 20 to eliminate the two least significant bits. Thus the digital baseband signal 20 output from the first bit reduction circuit 23 has 14 bits.

The second bit reduction circuit 24 comprises first and second stages 25 and 26. The first stage 25 reduces the number of bits of the digital baseband signal 20 output from the filter circuit 9 by truncating the digital baseband signal 20 to eliminate the two least significant bits. Thus the digital baseband signal 20 output from the first stage 25 has 12 bits. The second stage 26 reduces the number of bits of the digital baseband signal 20 output from the first stage 25 by limiting the digital baseband signal 20 to eliminate the most significant bit. Thus the digital baseband signal 20 output from the second stage 26 has 11 bits.

By performing some of the bit reduction before the filtering performed by the filter circuit 21, there is achieved the advantage that the size of the filter circuit 21 is reduced, as compared to performing the bit reduction after the filter circuit 21. In particular, the bit reduction from 16 to 14 bits means that the silicon area taken up by the filter circuit 21 is reduced by more than 12.5%. This reduces the cost of manufacture.

However this advantage is achieved whilst still meeting the relevant performance parameters of the 3GPP standard. This is achieved by splitting the performance of bit reduction before and after the filtering performed by the filter circuit 21, as will now be described.

The relevant performance parameters of the 3GPP standard affected by the bit reduction are: ACLR (Adjacent Channel Leakage Ratio), EVM (Error Vector Magnitude) and Code Domain Power Accuracy (CDPA). An explanation of these performance parameters will now be given.

Figure 3:
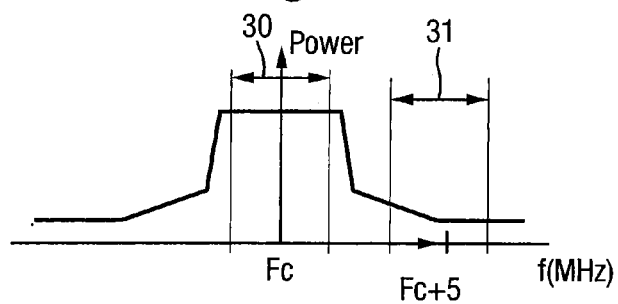
FIG. 3 is a graph of the power of a 3G signal over frequency.

ACLR will be explained with reference to FIG. 3 which shows the spectrum of a 3G signal. In FIG. 3, a given channel 30 has a carrier signal of frequency Fc and an adjacent channel 31 has a carrier signal of frequency Fc+5 MHz, each channel 30 and 31 having a bandwidth of 3.84 MHz. ACLR is the ratio (in dB) of the power measured in the given channel 30 to the power measured in the adjacent channel 31. A typical specification for ACLR of the transmission circuit 1 as a whole is 42 dB. ACLR due to the processing of the digital baseband signal alone must be considerably better than 42 dB, for example better than 50 dB.

Figure 4:
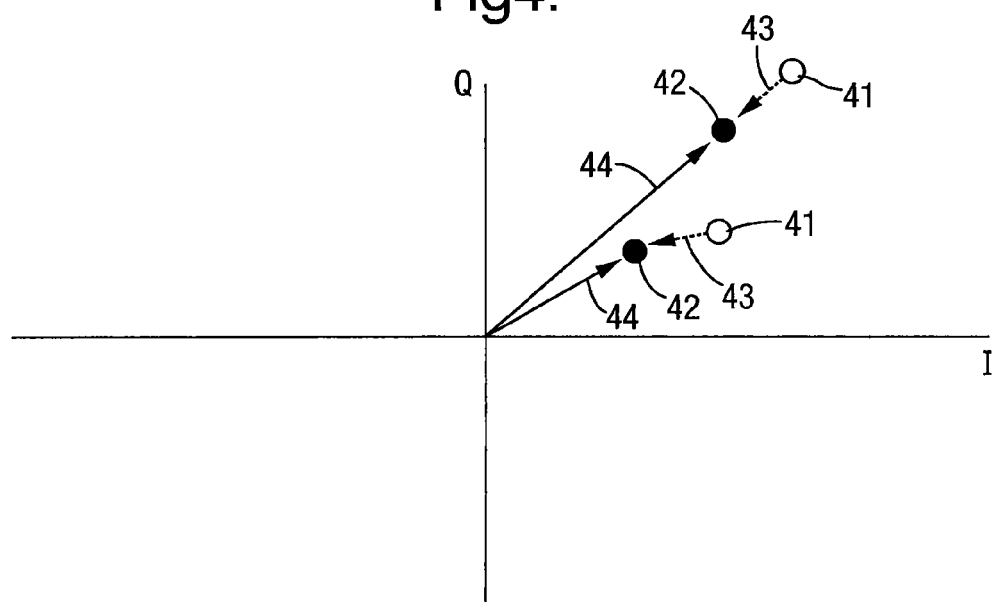
FIG. 4 is a constellation diagram for measurements of actual and ideal samples at a receiver.

EVM will be explained with reference to FIG. 4 which shows a constellation diagram in imaginary space of I samples against Q samples when received by an ideal receiver. FIG. 4 shows measured samples 41 which represent the signal actually measured by the receiver when transmitted by the transmitter circuit 1, as compared to reference sample 42 which represent the signal which would be measured by the receiver if the transmitter circuit 1 was ideal. An error vector 43 is defined from each measured sample 41 to the corresponding reference sample 42. A reference vector 44 is defined from the origin to each reference sample 42. For clarity FIG. 4 only shows points due to two samples, but in practice thousands of samples would typically be considered. EVM is defined as the ratio of the RMS power of the error vectors 43 to the RMS power of the reference vectors 44. Hence EVM (as a percentage) is given by the equation:

$$100 \times \sqrt{(\text{mean}(|\text{error vector } 43|^2)/\text{mean}(|\text{reference vector}|^2))}$$

A typical specification for EVM of the transmission circuit 1 as a whole is 9%. The EVM due to the processing of the digital baseband signal alone must be considerably better than this, for example less than 1%.

CDPA relates to the accuracy of the power of different channels of the digital baseband signal. A typical specification for CDPA is that the ratio of the power in a control channel (one of the DPCCH channels) to the power in another channel must be within ±0.1 dB of the ideal ratio. For example if a signal configuration contains a DPCCH weighted with gain factor 15 and a DPDCH weighted with gain factor 1 the ideal ratio is 20 log 10 (1/15)=−23.52 dB. After quantisation, the ratio of the gain factors might not be exactly 1/15, but must stay within 0.1 dB of this value. This specification refers to the output of the digital baseband, ie in the digital baseband signal as supplied to the DAC 6.

These performance parameters may be evaluated using test signals. There are many possible test signal configurations, but two can be chosen as worst case for the performance parameters described above.

The worst case signal for ACLR is given in Table 1:

TABLE 1

| Channel | DPCCH | DPDCH | HS-DPCCH | EDPCCH | EDPDCH1 |
| --- | --- | --- | --- | --- | --- |
| Weighting Factor | 6 | 15 | 2 | 12 | 15 |
| Spreading Code | Cch256,0 | Cch4,1 | Cch256,64 | Cch256,1 | Cch4,2 |
| I/Q Mapping | Q | I | Q | I | I |

After filtering in the filter circuit 21, this test signal has a high crest factor (up to 12 dB) and a high cubic metric (around 3), making it worst case for ACLR.

Crest factor is the ratio of the signal peak to its RMS value. Cubic Metric is defined in 3GPP 25.101 section 6.2.2, it is a signal metric that correlates strongly with the ACLR component due to distortion when the signal passes through a non-linearity. The higher the Cubic Metric, the higher the adjacent channel power due to distortion.

The worst case signal for CDPA is given in Table 2:

TABLE 2

| Channel | DPCCH | DPDCH | HS-DPCCH | EDPCCH | EDPDCH1 | EDPDCH2 |
| --- | --- | --- | --- | --- | --- | --- |
| Weighting Factor | 6 | 15 | 2 | 12 | 15 | 168 |
| Spreading Code | Cch256,0 | Cch4,1 | Cch256,64 | Cch256,1 | Cch4,2 | Cch4,2 |
| I/Q Mapping | Q | I | Q | I | I | Q |

This signal is worst case for CDPA as the DPDCH is at its minimum weighting factor whereas all the other channels are at their maximum weighting factors. If resolution is not sufficient, quantisation of the gain factors can distort the ratio between the DPDCH and the DPCCH such that the ratio is not within 0.1 dB of the ideal value of −23.52 dB.

Both test signals are also used to validate EVM.

The weighting factors given above are ideal values. When implemented in the baseband IC, however, they are quantised values. They are chosen such that the total signal RMS after scrambling is $2^{14}-0.5=16383.5$. For example the weighting factors for the worst case signal for CDPA (i.e. Table 2) after quantisation are given in Table 3:

TABLE 3

| Channel | DPCCH | DPDCH | HS-DPCCH | EDPCCH | EDPDCH1 | EDPDCH2 |
|---|---|---|---|---|---|---|
| Weighting Factor | 1016 | 68 | 2033 | 2033 | 11382 | 11382 |

After scrambling, the RMS on the I branch equals the RMS on the Q branch, both equalling $16383.5/(\sqrt{2})$. This allows the worst case crest factor signal to be contained in 16 bits. The worst case crest factor before filtering in the filter circuit 22 is 9 dB or 2.82.

For the worst case test signals, the following performance was achieved. An ACLR of 51.6 dB was achieved, against a requirement of better than 50 dB. An EVM of 0.76% was achieved, against a requirement of less than 1%. CDPA was passed, the ratio of power in DPDCH to power in DPCCH being −23.49 dB, inside the limit of −23.52±0.1 dB.

The reasons why the bit reduction allows these performance parameters to be met is as follows.

Considering ACLR, there are several contributors to unwanted power in the adjacent channel due to the digital baseband. They include distortion, the amount of adjacent channel rejection by the filter circuit 21 (dependent on the number of taps) and quantisation noise. Quantisation noise depends upon the number of bits, in this case the number of bits after the truncation by the first stage 25 of the second bit reduction circuit 24 at the output of the filter circuit 21. A good figure for the quantisation noise so that overall good ACLR is achieved is 66 dB below the signal RMS. Knowing this and the worst case signal crest factor, the required system dynamic range at the filter circuit 21 output can be calculated. An additional 12 dB of dynamic range is required due to the crest factor (noting that the filtering increases the crest factor), and an additional 6 dB of dynamic range is required due to the peak-to-peak ratio being twice the magnitude of the peak value. Consequently, the system dynamic range equals 84 dB.

At an over-sampling ratio of four, 11 bits would allow a system dynamic range of 83 dB and 12 bits would allow 89 dB. Therefore 12 bits is required for the digital baseband signal 20 after the truncation occurring in the first stage 25 of the second bit reduction circuit 24.

However it has been appreciated that further bit reduction can be achieved by performing limitation in the second stage 26 of the second bit reduction circuit 24. This is because the largest signal peaks are quite rare events, typically exceeding 9 dB above the RMS less than 0.1% of the time. In other words the crest factor is 9 dB or less for 99.9% of the time. This means that limitation in the second stage 26 of the second bit reduction circuit 24 to eliminate the most significant bit can be performed. Whilst the limitation introduces distortion, this is at an acceptable level such that an ACLR of more than 50 dB is still achieved at the output of processing circuit 9.

A truncation to 11 bits in the second bit reduction circuit 24 would achieve similar ACLR performance but CDPA would become marginal.

The additional reduction from 12 to 11 bits achieved by the limiting means that the size of the DAC 6 is further reduced. The area of an 11 bit DAC is approximately 33% less than that required for a 12 bit DAC, this reducing the cost of manufacture.

Figure 5:
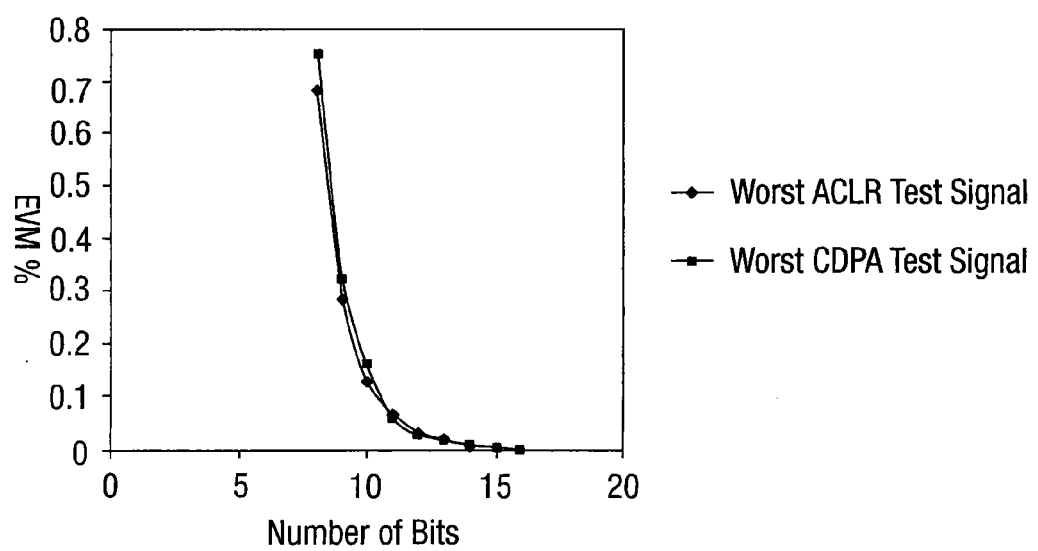
FIG. 5 is a graph of EVM against the number of bits at the output of the digital baseband.

EVM will now be considered with reference to FIG. 5 which is a graph of EVM against the number of bits at the output of the processing circuit 9 for each test signal, showing how EVM degrades due to bit reduction. FIG. 5 shows that EVM is not as sensitive to a reduction in the number of bits as ACLR. The EVM due to a reduction to 11 bits is less than 0.1% which is small compared to the limit for the digital baseband of 1%.

CDPA contrasts with the ACLR and EVM requirements for which all the bit reduction could be done at the input to the digital baseband. It has been appreciated that in order to meet CDPA, the maximum bit reduction before the filter circuit 21 is 2 bits, for the following reasons.

The quantised weighting factors of the worst case CDPA test signal are shown in Table 4:

TABLE 4

| Channel | DPCCH | DPDCH | HS-DPCCH | EDPCCH | EDPDCH1 | EDPDCH2 |
|---|---|---|---|---|---|---|
| Weighting Factor | 1016 | 68 | 2033 | 2033 | 11382 | 11382 |

Herein, the ratio of DPDCH power to DPCCH power is $20 \log 10 (68/1016)=-23.49$ dB. This is within ±0.1 dB of the ideal ratio of $20*\log 10 (1/15)=-23.52$ dB. As 68 and 1016 are both divisible by 22, truncating two bits (from 16 to 14) will still preserve this ratio as DPCCH and DPDCH undergo the same power of 2 scaling factor, to provide the weighting factors shown in Table 5:

TABLE 5

| Channel | DPCCH | DPDCH | HS-DPCCH | EDPCCH | EDPDCH1 | EDPDCH2 |
|---|---|---|---|---|---|---|
| Weighting Factor | 254 | 17 | 508 | 508 | 2846 | 2846 |

This means the ratio of DPDCH power to DPCCH power remains at the same value, that is 20 log 10 (17/254)=−23.49 dB.

As 17 is not divisible by 2 but 254 is, further truncation at this point will mean that DPCCH and DPDCH no longer undergo the same scaling factor, the ratio is no longer preserved and CDPA will not be met.

Figure 6:
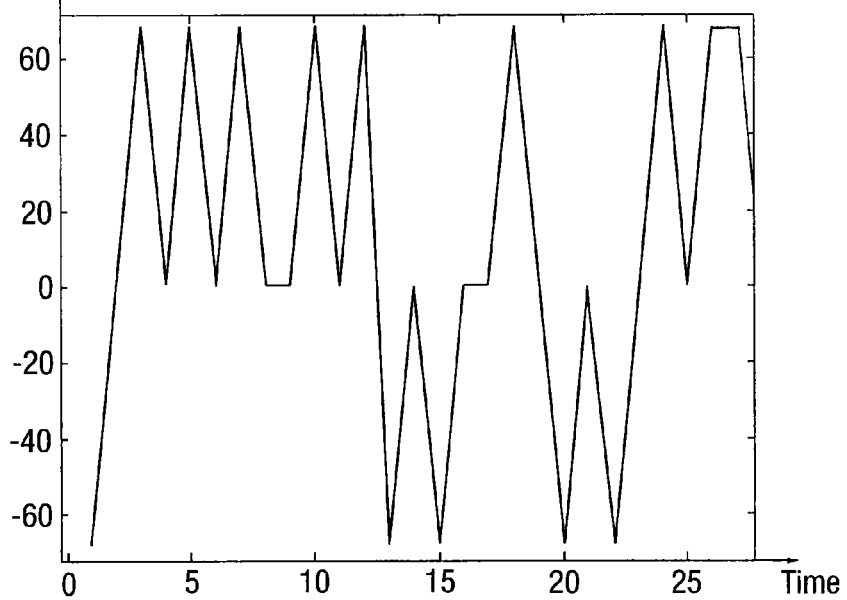
FIG. 6 is a graph of a data channel of a test digital baseband signal.

However, further bit reduction can be done though at the output of the filter circuit 21. To illustrate this, FIG. 6 shows an example of just the DPDCH channel of the above test signal after scrambling. It takes on just three states, that is +68, −68 and 0. It has an RMS of $68/(\sqrt{2})$. Truncation to 14 bits scales the RMS down by a power of 2 (i.e. $2^2$) to $17/(\sqrt{2})$. Further truncation will not scale the RMS by a power of 2 due to quantisation errors and causes CDPA failure as mentioned above.

Figure 7:
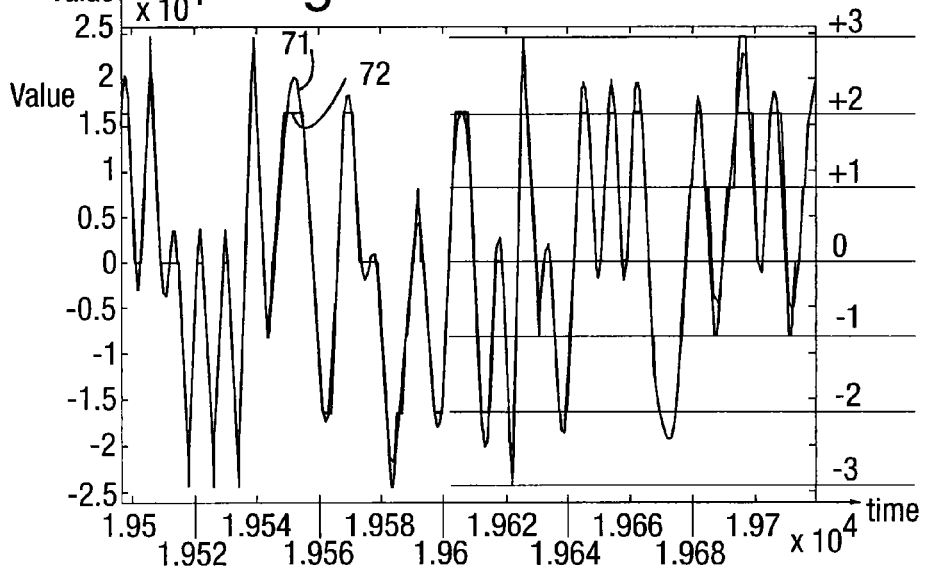
FIG. 7 is a graph of a data channel of the same test signal after filtering.

By way of comparison, FIG. 7 shows the DPDCH channel of the same test signal at the output of the filter circuit 21, this being illustrated by the unclipped trace 71 and taking on many states. The signal after truncation to 12 bits in the first stage 25 of the second bit reduction circuit 24 is shown by the clipped trace 72. Thus FIG. 7 shows that after truncation the DPDCH channel uses more states, in particular seven states, i.e. ±3, ±2, ±1 and 0. Although the truncated DPDCH channel only exercises 7 states, far less than the many levels of the DPDCH channel at the output of the filter circuit 21, its RMS is approximately the same apart from a power of 2 scaling. The power of 2 scaling relating the RMS of the DPDCH channel at the output of the filter circuit 21 to the RMS of the DPDCH channel after truncation is equal to 2 exp (Number of bits in the accumulator−12), the "Number of bits in the accumulator" being typically 27. The RMS of the DPCCH channel undergoes the same scaling factor. The ratio of power in the DPDCH channel to power in the DPCCH channel is therefore preserved and CDPA is met.

It is also noted that the limiting to 11 bits in the second stage 26 of the second bit reduction circuit 24 only affects the signal peaks and not the RMS, so does not affect CDPA.

CDPA becomes marginal if truncating to 11 bits after the filter circuit 21 and fails if truncating to 10 bits or less.

Whilst the above explanation describes a specific example in which the transmission circuit 1 is in accordance with 3GPP standard and with specific values of the performance parameters, the principles may be generalised to other standards and other values of relevant performance parameters. In such other cases, the degree of bit reduction may vary, but advantage is achieved by splitting performance of the bit reduction before and after filtering.

As a final point, there will now be described some specific examples for the design of the DACs 6 in the transmission circuit 1, the DACs being identical.

Each DAC 6 receives an 11 bit digital baseband signal and convert it into an analog signal. The DAC 6 is formed with a 7-bit binary-weighted DAC stage in combination with a 4-bit current-switched DAC stage.

The 7-bit binary-weighted DAC stage has a conventional construction in which contains one resistor or current source for each bit of the DAC stage connected to a summing point.

Figure 8:
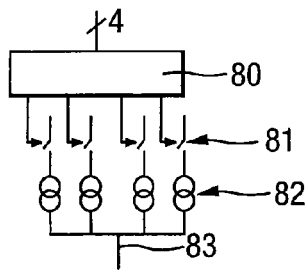
FIG. 8 is a diagram of a current-switched DAC stage.

The 4-bit current-switched DAC stage is shown in FIG. 8. It comprises a thermometer coder 80 which converts the digital baseband signal from a binary coding to a thermometer code (or unary code) in which each bit has an identical weighting. Thus the thermometer code has sixteen bits. The individual bits of the thermometer code control the opening and closing of respective switches 81 which each switch a respective current source 83. The outputs of the current sources 83 are summed to produce the analog signal.

In this arrangement, the high bit-count means there are a large number of devices. For example, the two stages might typically require 22 current sources, requiring say 88 devices. Such a large number of devices causes a risk of inaccuracy, for which the key parameters are DNL (differential non-linearity) and INL (integral non-linearity). DNL and INL are inversely proportional to the width and length of the devices (typically MOS transistors) used in the current sources. Due to process variations, device performance varies with physical position on the die, which in turn leads to DNL and INL.

The accuracy of the DACs 6 may be improved by modifying the current sources 82 of the current-switched DAC stage as shown in FIG. 9 to improve the current matching. In particular each current source 83 is replaced by a group of four current sources 84 (or in general any number of current sources). The current sources 84 and then arranged in a layout 85 on the wafer in which the current sources 84 corresponding to each bit of the thermometer code are spread out over the wafer. In the layout 85 the location of current sources 84 are indicated by labels Dx where x signifies the bit of the thermometer code which drives the current source 84.

By spreading out the current sources 84, better matching between the bits of the thermometer code is achieved, thereby reducing DNL and INL. Ideally, the group of current sources 84 corresponding to each bit of the thermometer code are evenly distributed in the horizontal and vertical directions of the wafer. To the extent that the wafer variations are linear in the horizontal and vertical directions, this substantially removes DNL and INL. The even distribution is achieved in FIG. 9 by arranging the current sources 84 in respective areas 86 distributed across the wafer, each area 86 containing a current source 84 of each bit of the thermometer code. The areas 86 contain current sources 84 in a 4×4 array. The current sources 84 of each bit of the thermometer code are arranged in different rows and columns in each area 86. Of course other distributions can be used to even spread the current sources 84.

The invention claimed is:

1. A method of processing an input digital baseband signal for radio frequency transmission, the method comprising:
   first reducing, in an integrated circuit, a number of bits of the input digital baseband signal to generate a reduced input digital baseband signal;
   upsampling the reduced input digital baseband signal before filtering thereof;
   filtering, in the integrated circuit, the reduced input digital baseband signal after upsampling to generate a filtered digital baseband signal;
   second reducing, in the integrated circuit, a number of bits of the filtered digital baseband signal after said filtering to produce a bit-reduced digital baseband signal having a number of bits less than the input digital baseband signal;

performing, in the integrated circuit, digital-to-analog conversion of the bit-reduced digital baseband signal to generate an analog baseband signal; and modulating, in the integrated circuit, the analog baseband signal onto a carrier to generate a transmission signal for radio frequency transmission.

2. A method according to claim 1, wherein said first reducing of the number of bits comprises truncating the input digital baseband signal to eliminate at least one of the least significant bits.

3. A method according to claim 2, wherein said first reducing of the number of bits comprises truncating the input digital baseband signal to eliminate the two least significant bits.

4. A method according claim 1, wherein said second reducing of the number of bits comprises truncating the filtered digital baseband signal to eliminate at least one of the least significant bits.

5. A method according to claim 4, wherein said second reducing of the number of bits comprises truncating the filtered digital baseband signal to eliminate the two least significant bits.

6. A method according to claim 4, wherein said second reducing of the number of bits additionally comprises limiting the filtered digital baseband signal to eliminate at least one of the most significant bits.

7. A method according to claim 6, wherein said second reducing of the number of bits after said filtering additionally comprises limiting the filtered digital baseband signal after said filtering to eliminate the most significant bit.

8. A method according to claim 1, wherein said upsampling is at a rate of at least four times the existing sampling rate of the input digital baseband signal.

9. A method according to claim 1, wherein said upsampling of the reduced input digital baseband signal is performed after said first reducing of the number of bits.

10. A method according claim 1, wherein the input digital baseband signal has 16 bits.

11. A method according to claim 1, wherein the input digital baseband signal contains plural channels having differing gain factors.

12. A method according to claim 11, wherein the plural channels include at least one data channel and at least one control channel 13. A method according to claim 11, wherein the input digital baseband signal is in accordance with the 3GPP standard.

14. A method according to claim 1, wherein said filtering comprises finite-impulse response filtering.

15. The method according to claim 1, wherein the input digital baseband signal is filtered immediately after upsampling.

16. An integrated circuit for processing an input digital baseband signal for radio frequency transmission, the input digital baseband signal having a predetermined number of bits, the integrated circuit comprising:

a first bit reduction circuit arranged to reduce the number of bits of the input digital baseband signal to generate a reduced input digital baseband signal;

an upsampling circuit arranged to perform upsampling of the reduced input digital baseband signal before filtering thereof;

a filter circuit arranged to filter the reduced input digital baseband signal after upsampling by upsampling circuit to generate a filtered digital baseband signal;

a second bit reduction circuit arranged to reduce the number of bits of the filtered digital baseband signal output from the filter circuit to produce a bit-reduced digital baseband signal having a number of bits less than the predetermined number of bits of the input digital baseband signal;

a digital-to-analog converter arranged to perform digital-to-analog conversion of the bit-reduced digital baseband signal output from the second bit reduction circuit and having a number of bits less than the predetermined number of bits of the input digital baseband signal to generate an analog baseband signal; and a modulation circuit arranged to modulate the analog baseband signal generated by the digital-to-analog converter onto a carrier to generate a transmission signal for radio frequency transmission.

17. An integrated circuit according to claim 16, wherein the first bit reduction circuit arranged is arranged to truncate the input baseband signal to eliminate at least one of the least significant bits.

18. An integrated circuit according to claim 17, wherein the first bit reduction circuit arranged is arranged to truncate the input baseband signal to eliminate the two least significant bits.

19. An integrated circuit according to claim 16, wherein the second bit reduction circuit arranged is arranged to truncate the filtered digital baseband signal to eliminate at least one of the least significant bits.

20. An integrated circuit according to claim 19, wherein the second bit reduction circuit arranged is arranged to truncate the filtered digital baseband signal output from the filter circuit to eliminate the two least significant bits.

21. An integrated circuit according to claim 19, wherein the second bit reduction circuit arranged is arranged additionally to limit the filtered digital baseband signal output from the filter circuit to eliminate at least one of the most significant bits.

22. An integrated circuit according to claim 21, wherein the second bit reduction circuit arranged is arranged additionally to limit the filtered digital baseband signal output from the filter circuit to eliminate the most significant bit.

23. An integrated circuit according to claim 16, wherein the upsampling circuit is arranged to perform upsampling at a rate of at least four times the existing sampling rate of the reduced input digital baseband signal.

24. An integrated circuit according to claim 16, wherein the upsampling circuit is arranged to perform upsampling the reduced input digital baseband signal output from the first bit reduction circuit.

25. An integrated circuit according to claim 16, wherein the predetermined number of bits is 16 bits.

26. An integrated circuit according to claim 16, wherein the input digital baseband signal contains plural channels having differing gain factors.

27. An integrated circuit according to claim 26, wherein the plural channels include at least one data channel and at least one control channel.

28. An integrated circuit according to claim 26, wherein the input digital baseband signal is in accordance with the 3GPP standard.

29. An integrated circuit according to claim 16, wherein the filter circuit is a finite-impulse response filter circuit.

30. A radio frequency transmission circuit comprising:
a digital baseband integrated circuit arranged to produce a digital baseband signal; and
a transmitter integrated circuit, being an integrated circuit according to claim 16, supplied with the digital baseband signal produced by the digital baseband integrated circuit.

31. A portable electronic device incorporating an integrated circuit according to claim 16.

* * * * *